US005543815A

United States Patent [19]

Wu et al.

[11] Patent Number: 5,543,815

[45] Date of Patent: Aug. 6, 1996

[54] SHIELDING SCREEN FOR INTEGRATION OF MULTIPLE ANTENNAS

[75] Inventors: Te-Kao Wu, Rancho Palos Verdes; William W. Milroy, Playa del Rey; Steven W. Drost, Sherman Oaks, all of Calif.

[73] Assignee: Hughes Aircraft Company, Los Angeles, Calif.

[21] Appl. No.: 419,972

[22] Filed: Apr. 7, 1995

Related U.S. Application Data

[63] Continuation of Ser. No. 144,625, Nov. 1, 1993, abandoned, which is a continuation of Ser. No. 943,997, Sep. 11, 1992, abandoned, which is a continuation of Ser. No. 621,181, Nov. 30, 1990, abandoned.

[51] Int. Cl.$^{6}$ .......................... H10Q 15/14; H10Q 19/17; H10Q 21/28

[52] U.S. Cl. .......................... 343/909; 343/893; 343/912

[58] Field of Search .................................... 343/841, 909, 343/725, 910, 705, 708, DIG. 2, 756, 872, 893, 912, 913; H01Q 1/52, 15/00, 15/02, 15/10, 15/14, 15/23, 21/28, 21/30, 25/02, 25/00, 25/04, 19/17

[56] References Cited

U.S. PATENT DOCUMENTS

| | | | |
|---|---|---|---|
| 3,953,858 | 4/1976 | Ohm | 343/756 |
| 4,342,036 | 7/1982 | Scott et al. | 343/836 |
| 4,656,487 | 4/1987 | Sureau et al. | 343/909 |
| 4,684,954 | 8/1987 | Sureau et al. | 343/909 |
| 4,785,310 | 11/1988 | Rosen | 343/909 |
| 4,814,785 | 3/1989 | Wu | 343/909 |
| 5,130,718 | 7/1992 | Wu et al. | 343/909 |
| 5,162,809 | 11/1992 | Wu | 343/909 |

*Primary Examiner*—Peter Toby Brown
*Attorney, Agent, or Firm*—Leonard A. Alkov; Wanda K. Denson-Low

[57] ABSTRACT

A shielding screen for use in an integrated antenna system that includes at least two antennas that emit interfering signals that interfere with each other and at least one antenna that emits a non-interfering signal that does not interfere with the interfering signals. The shielding screen incorporates a frequency selective surface configured and dimensioned to reflect the interfering signals and to transmit the non-interfering signals. The shielding screen is positioned between the antennas that emit interfering signals and has a surface disposed substantially orthogonal to a line extending therebetween. The screen is dimensioned to block the interfering signals emitted by each of the two antennas from impinging upon the other of the antennas.

28 Claims, 3 Drawing Sheets

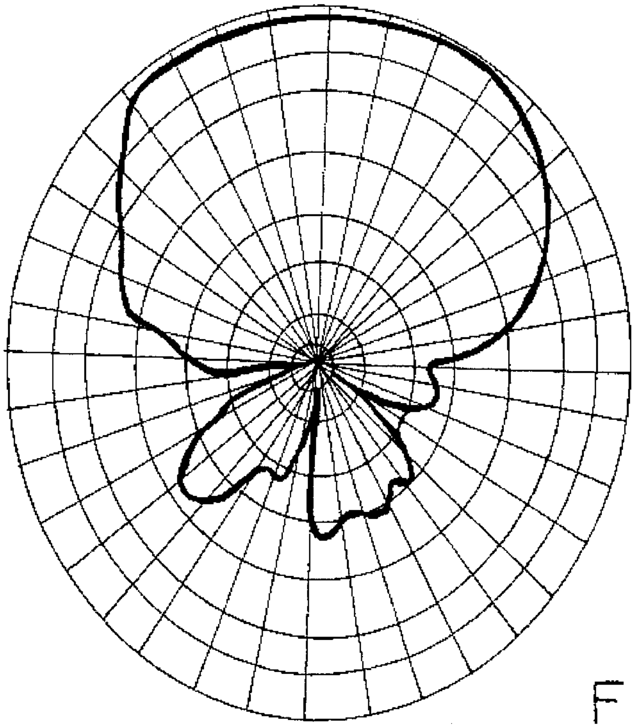
Fig. 5.
Fig. 6.
(PRIOR ART)
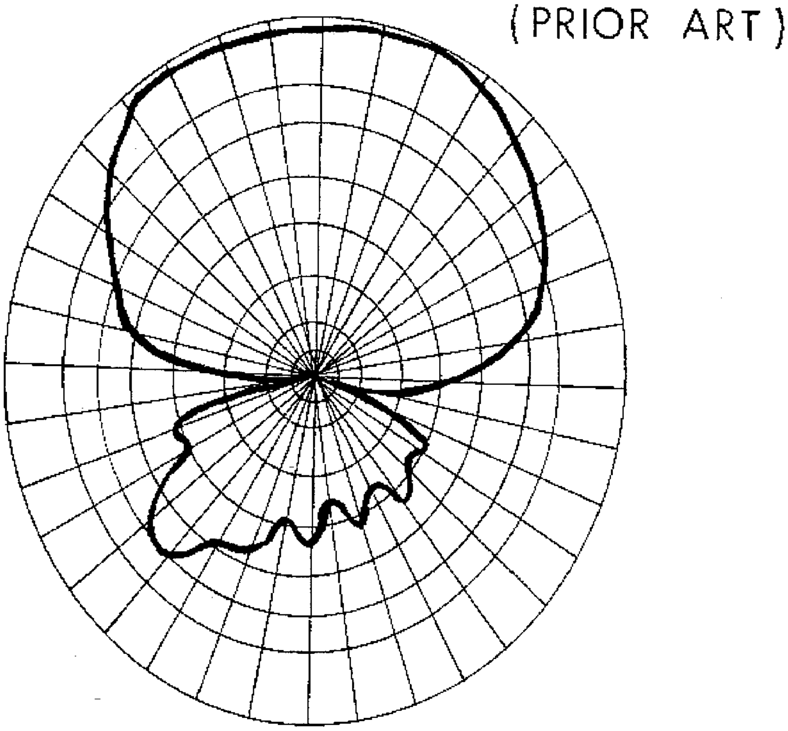

SHIELDING SCREEN FOR INTEGRATION OF MULTIPLE ANTENNAS

The present application is a continuation of U.S. patent application Ser. No. 08/144,625, filed Nov. 1, 1993, now abandoned, which is a continuation of U.S. patent application Ser. No. 07/943,997, filed Sep. 11, 1992, now abandoned, which is a continuation of U.S. patent application Ser. No. 07/621,181, filed Nov. 30, 1990, now abandoned.

BACKGROUND

The present invention relates generally to shielding screens for preventing radio signal interference between antennas of an integrated antenna system, and in particular to a shielding screen that includes a frequency selective surface that blocks radio frequency signals in a predetermined stop band and transmits radio frequency signals in a predetermined passband.

It is common for an antenna installation to include multiple antennas. Frequently, two or more of the antennas emit radio signals at closely adjacent frequencies, and other antennas emit radio signals at a substantially different frequency. For example, two radar antennas may operate at X-band, and a communication antenna may operate in the UHF band. Heretofore, solid metal plates have been used to shield two X-band antennas from interfering with each other. However, the immediate proximity of this metal plate to a UHF antenna typically causes adverse effects in performance. Such a solid metal plate reflects UHF signals. Such systems are found, for example, in shipboard antenna installations and in various land-based and aircraft-based communications systems wherein the vehicle or topography necessitate integrating multiple antennas in closely adjacent positions.

Therefore a need exists for a shielding screen which can be positioned between two or more antennas of an integrated antenna system that emit signals at closely adjacent frequencies which effectively blocks the signals from one of the antennas from interfering with the signals emitted from the other and which simultaneously transmits signals emitted from other antennas of the integrated antenna system which emit signals at a substantially different frequency.

It is therefore an objective of the invention to provide an improved shielding screen for use in multiple antenna systems. Another objective of the invention is to provide a shielding screen which blocks radio signals in a predetermined stop band and transmits signals in a frequency-displaced pass band. Yet another objective of the invention is to provide a shielding screen which includes a frequency selective surface that is substantially invisible to radio signals in a predetermined pass band and provides adequate attenuation to radio signals in a stop band. Still another objective of the invention is to provide a shielding screen comprised of a multiplicity of conductor elements supported on a thin dielectric substrate, and wherein the conductor elements are configured and dimensioned to reject or reflect radio frequency signals in a stop band and to substantially transmit radio frequency signals in a pass band. Another objective of the invention is to provide a shielding screen which operates effectively when positioned at angles up to 60° with respect to a line normal to the plane of an antenna. Still another objective of the invention is to provide a shielding screen that is easily fabricated, flexible, and low in cost.

SUMMARY OF THE INVENTION

Broadly, the invention is a radio signal shielding screen for use in an integrated antenna system that includes at least two antennas emitting interfering radio signals and at least one antenna emitting a non-interfering signal. The shielding screen includes a frequency selective surface comprised of an array of conductor elements supported on a dielectric substrate. The conductor elements are configured and dimensioned to reject or reflect radio signals having frequencies in the interfering signal frequency band and to transmit radio signals having frequencies in the non-interfering signal frequency band. The frequency selective surface is positioned between the antennas emitting interfering radio signals and has a surface area orthogonal to the transmission axes of the antennas emitting interfering signals dimensioned to block interfering radio signals from impinging on adjacent antennas also emitting interfering radio signals. Examples of frequency selective surfaces that exhibit resonance (substantial reflectance) in one or more frequency bands and signal transparency in other bands are cited in presently copending U.S. patent applications Ser. No. 07/601,843, filed Oct. 23, 1990, for "Multiple Dichroic Surface Cassegrain Reflector" and Ser. No. 07/601,844, filed Oct. 23, 1990, for "Polarization Independent Frequency Selective Surface For Diplexing Two Closely Spaced Frequency Bands", for example.

In a specific embodiment of the invention, the frequency selective surface includes a symmetrical array of open center square conductor elements supported on a thin polyimide substrate. The frequency selective surface substantially rejects or reflects interfering radio frequency signals and transmits non-interfering radio frequency signals that impinge on the surface at angles up to 60°.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 5 is a graph showing the radiation pattern of an antenna emitting signals in a non-interfering frequency band with a frequency selective surface;

FIG. 6 is a graph showing the radiation pattern of the antenna of FIG. 5 without a frequency selective surface;

DETAILED DESCRIPTION

Figure 1:
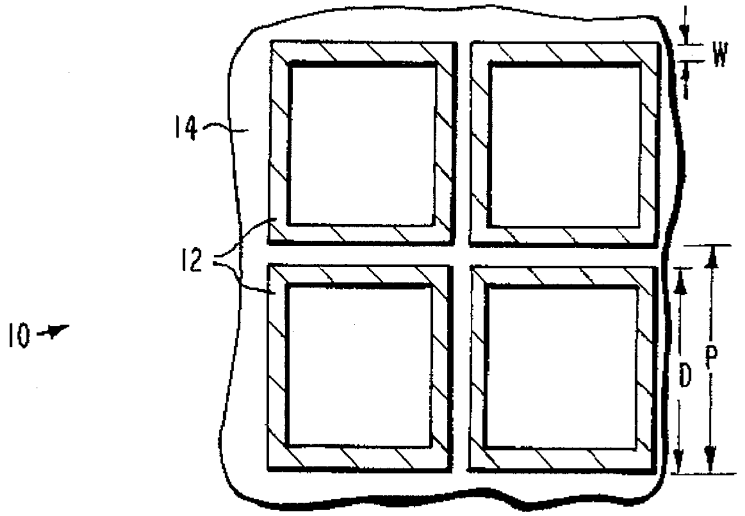
FIG. 1 is a fragmentary plan view of a portion of a frequency selective surface suitable for use as a shielding screen in the present invention.

Referring now to the drawings, there is shown in FIG. 1 a fragmentary portion of a frequency selective surface 10 for use in the present invention. The surface 10 comprises a multiplicity of open center square conductor elements 12 supported in a symmetrical array on the surface of a dielectric substrate 14. These open center square conductor elements 12 define a square-loop, patch element frequency selective screen. This screen has a passband and a stop band. It transmits signals in the passband while rejecting signals in the stop band. Typically, the conductor elements 12 are made of a metal conductor such as copper and can be formed by etching a copper film bonded to the surface of the substrate 14. The substrate 14 is preferably very thin, less than 0.005 inches in thickness, and is made of a material such as polyimide. A substrate comprised of 0.001 inch thick "Kapton" has been used with good results.

Figure 2:
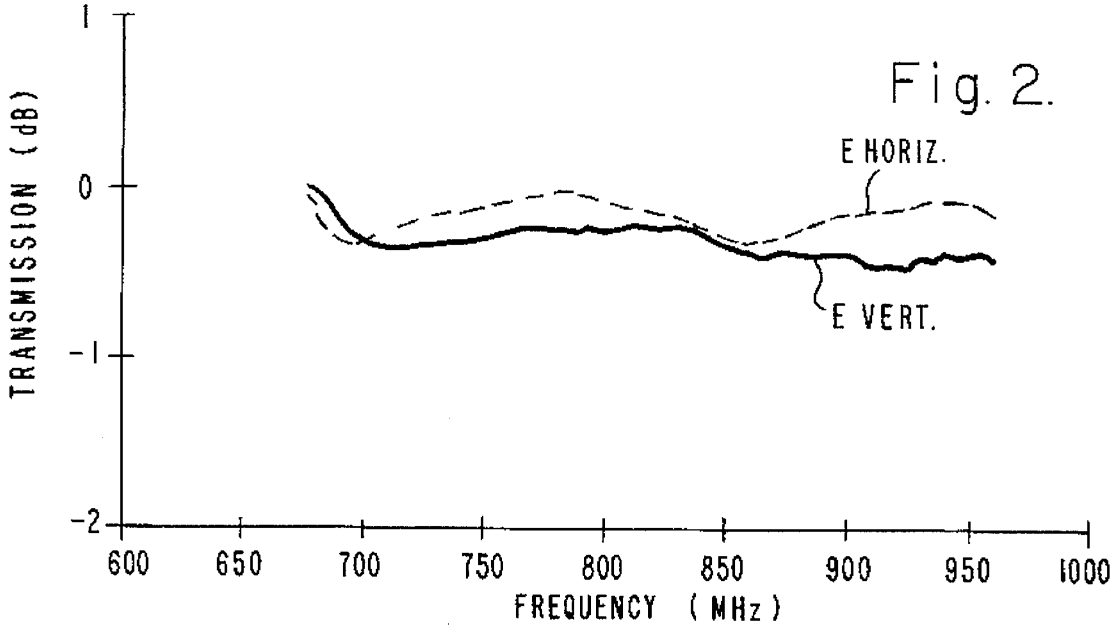
FIG. 2 is a graph showing the transmission characteristic of the frequency selective surface of FIG. 1 in the non-interfering signal frequency band, or the passband.

In a working embodiment of the invention, the surface 10 is dimensioned to be substantially transparent to signals in the UHF frequency band, a band extending for example between 300 and 3000 MHz, and to substantially reflect signals in X-band, that is, signals having frequencies between 8500 and 10680 MHz. This frequency selective screen is used to shield two or more antennas operating within the stop band from interfering with each other, while causing negligible effects to antennas operating within the passband. This is achieved by dimensioning the array to have a periodicity (the distance between corresponding points of adjacent conductors) of 0.394 inches in both the vertical and horizontal directions (as viewed in the drawings). The side length D of the conductor elements 12 is 0.345 inches and the width W of the conductor elements 12 is 0.0246 inches. The transmission characteristic of this surface of UHF frequencies is shown in FIG. 2. The measured insertion loss is less than 0.5 dB for both horizontally and vertically polarized electric fields.

Figure 3:
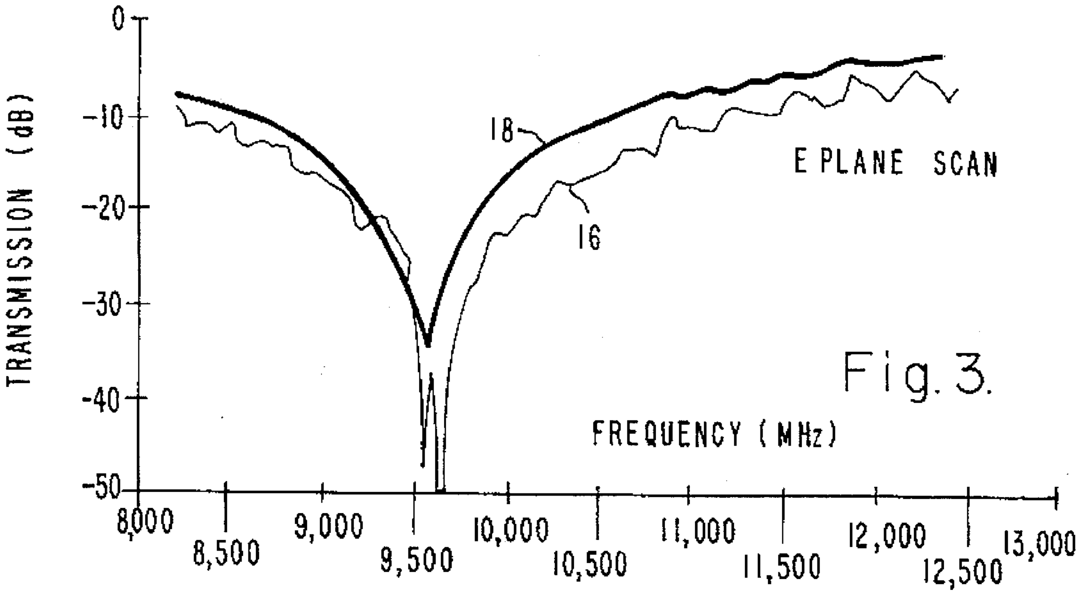
FIG. 3 is a graph showing the E-plane transmission characteristic of the frequency selective surface of FIG. 1 in the interfering signal frequency band, or the reflection band.
Figure 4:
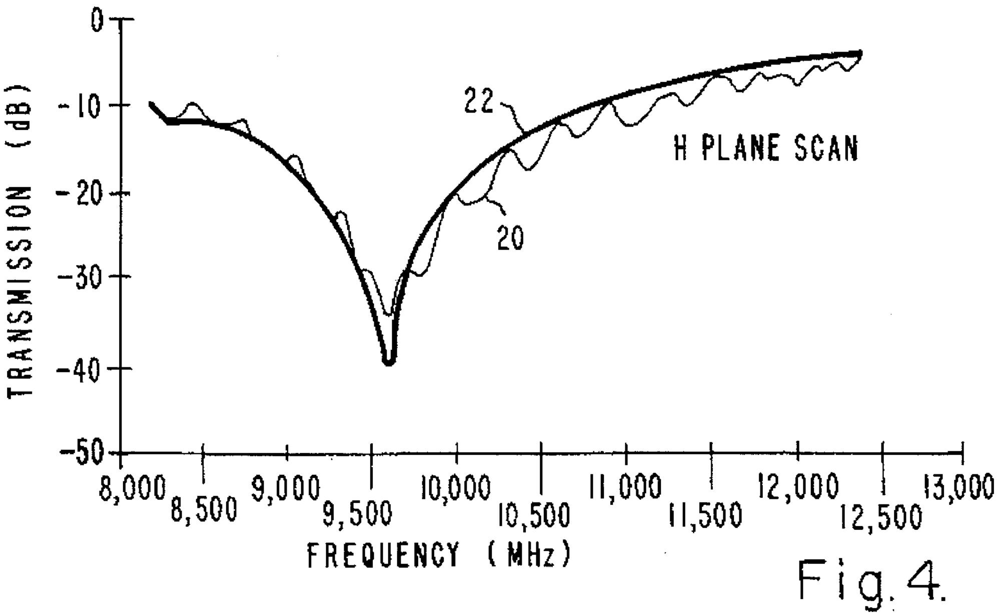
FIG. 4 is a graph showing the H-plane transmission characteristic of the frequency selective surface of FIG. 1 in the interfering signal frequency band, or the reflection band.

The measured transmission performance of the surface 10 at X-band frequencies is shown in FIGS. 3 and 4. Two graph lines 16, 18 in FIG. 3 illustrate transmission performance of the surface 10 in the E-plane at signal incidence angles of 5° and 45°, respectively. Two graph lines 20, 22 in FIG. 4 illustrate the transmission characteristic of the surface 10 at signals incidence angles of 5° and 45° in the H-plane. It will be observed that the rejection band width is dependent on the incidence angle in the E-field in the polarization plane. However, the center rejection frequency remains unchanged for angles up to 60°. Furthermore the stop band provides at least about 20 dB attenuation (typically 40 dB) while the passband has an insertion loss of less than 0.5 dB.

Referring now to FIGS. 5 and 6, the radiation pattern of a dipole antenna operating in the UHF frequency band is shown. In FIG. 5, operation of the antenna is illustrated for the case wherein the antenna is positioned in proximity to a frequency selective surface such as surface 10 of FIG. 1. In FIG. 6, performance of the dipole antenna is shown in absence of a frequency selective surface 10. It is observed that performance of the dipole antenna is substantially unaffected by the presence of the frequency selective surface 10 in the radiation field.

Figure 7:
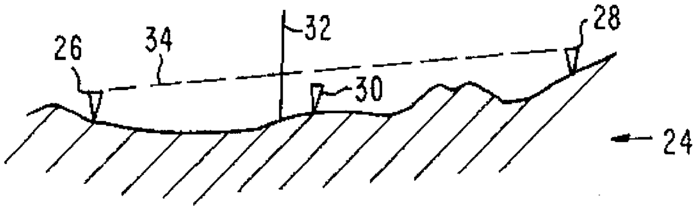
FIG. 7 is an illustration showing typical positioning of the shielding screen of the invention in an integrated antenna system.

Referring now to FIG. 7, there is illustrated schematically an integrated antenna system 24. The antenna system 24 includes a first antenna 26 operating in the X-band frequency band and a second antenna 28 also operating in the X-band frequency band. It will be recognized that signals emitted by the first and second antennas 26 and 28 interfere with signals emitted by the other of the antennas 26, 28 operating in the same frequency band. Such signals are herein referred to as interfering signals.

Also included in the integrated antenna system 24 is a third antenna 30 operating in the UHF frequency band. Signals emitted by the third antenna 30, because they are in a different frequency band, do not interfere with signals emitted by the first and second antennas 26 and 28 and signals emitted by the first and second antennas 26 and 28 do not interfere with signals emitted by the third antenna 30. Signals emitted by the third antenna 30 are herein referred to as non-interfering signals.

To substantially eliminate interference between the signals emitted by the first and second antennas 26 and 28, a shielding screen 32 is positioned between the first and second antennas 26 and 28. The shielding screen 32 is formed from a frequency selective surface such as surface 10 of FIG. 1. The shielding screen 32 is dimensioned to have an area perpendicular to a line 34 extending between the first and second antennas 26 and 28 that substantially blocks signals emitted from one of the first and second antennas 26, 28 from impinging on the other of the antennas 26, 28. Simultaneously, because the shielding screen 32 is formed of a frequency selective surface that is substantially transparent to UHF signals, it does not significantly affect UHF signals emitted by the third antenna 30.

In other words, the first and second antennas 26 and 28 interfere with each other. To reduce the electromagnetic interference between the first and second antennas 26 and 28, an RF (Radio Frequency) shielding screen 32 is installed between the first and second antennas 26 and 28, without interfering or affecting the performance of the third antenna 30. The characteristics of the shielding screen 32 are designed such that signals with frequencies within the operating bandwidths of the first and second antennas 26 and 28 are rejected or reflected, while signals within the operating bandwidth of the third antenna 30 are unaffected.

Figure 8:
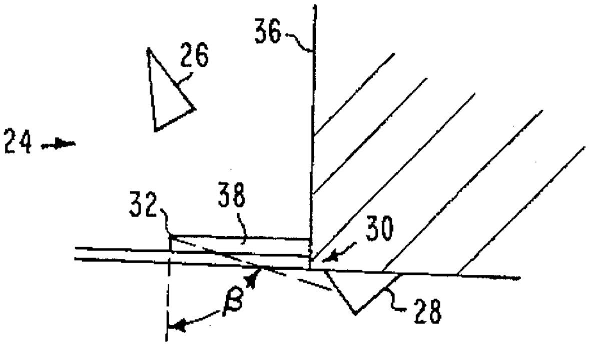
FIG. 8 is an illustration illustrating signal incidence angles.

To insure optimum performance of the shielding screen 32, it is best to maintain the angle of incidence of signals emitted from the three antennas 26, 28, 30 onto the shielding screen 32 to be less than 60°. For example, the incidence angle is indicated as angle β for antenna 28, respectively, in FIG. 8. The antennas 26, 28, 30 are shown in conjunction with a conductive supporting structure 36 such as may occur when the integrated antenna array is mounted on an object such as a ship or an aircraft, for example. The shielding screen 32 is separated from the supporting structure 36 and the third antenna 30 by means of a dielectric spacer 38.

Figure 9:
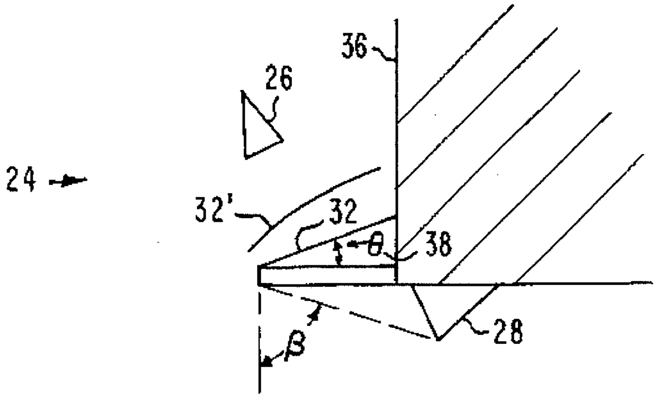
FIG. 9 is an illustration showing adjustment of the orientation of the shielding screen of the present invention.

In FIG. 9 the integrated antenna system 24 is shown with the shielding screen 32 rotated as indicated by angle θ to reduce the incidence angle β. Because the shielding screen 32 is made using a thin, flexible dielectric substrate supporting thin copper film conductors, it is also possible to form the shielding screen 32 as a curved structure 32' if such is required to achieve the desired incidence angles of less than 60°. The shielding screens 32, 32' are separated from the supporting structure 36 and the third antenna 30 by means of the dielectric spacer 38, which in this case has a triangular shape.

Because of its construction, the shielding screen 32 is light in weight, is easily fabricated, and is low in cost. Further, while the shielding screen 32 has been described in conjunction with a specific group of interfering and non-interfering signals, it will be apparent to those skilled in the art that various other frequency selective surfaces may be employed in place of the particular frequency selective surface 10 shown in FIG. 1. In accordance with the principles of the invention, any such surface used in the shielding screen rejects or reflects interfering radio frequency signals emitted by antennas of an integrated antenna system 24. Simultaneously, the shielding screen 32 is substantially transparent to radio frequency signals emitted by other antennas in the system emitting signals that do not interfere with radio signals emitted by others of the antennas in the system. Other frequency selective surfaces suitable for use in the shielding screen 32 of the present invention are disclosed in presently copending U.S. patent applications Ser. No. 07/601,843, filed Oct. 23, 1990, for "Multiple Dichroic Surface Cassegrain Reflector" and Ser. No. 07/601,844, filed Oct. 23, 1990, for "Polarization Independent Frequency Selective Surface For Diplexing Two Closely Spaced Frequency Bands", for example.

Thus there has been described a new and improved shielding screen for use in an integrated antenna system which includes at least two antennas that emit interfering signals that interfere with each other, and at least one antenna adapted to emit a non-interfering signal that does not interfere with the signals emitted by the two antennas. The screen of the present invention provides adequate shielding between antennas operating in the stop band (X-band, for example). It causes virtually no effects to the performance of an antenna operating in the pass band (UHF, for example). The screen of the present invention is constructed using printed wiring board fabrication techniques and therefore is inexpensive, light in weight, and flexible. Furthermore, it may easily be conformally mounted on any surface, flat or curved. Performance is invariant for any polarization and for incident angles up to 60°.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An antenna assembly comprising:

a first antenna adapted to operate at a first frequency in X-band;

a second antenna disposed adjacent to said first antenna and adapted to operate at a second frequency in X-band;

a third antenna disposed adjacent to said first and second antenna and adapted to operate at a third frequency in the UHF band; and a shielding screen having a frequency selective surface disposed between said first antenna and said second antenna and having a stop band at X-band and a passband in the UHF band.

2. An antenna assembly comprising:

a first antenna adapted to operate at a first frequency in X-band;

a second antenna disposed adjacent to said first antenna and adapted to operate at a second frequency in X-band;

a third antenna disposed adjacent to said first and second antenna and adapted to operate at a third frequency in the UHF band and a shielding screen having a frequency selective surface disposed between said first antenna and said second antenna and having a stop band at X-band and a passband in the UHF band, said shielding screen comprising a thin flexible insulating sheet having a conductive layer periodically etched in an array pattern of hollow square-loop patch elements.

3. The shielding screen of claim 2 in which the stop band provides at least about 20 dB attenuation and the passband has an insertion loss of less than 0.5 dB.

4. The shielding screen of claim 2 in which the stop band is from about 8500 MHz to 10680 MHz and the pass band is from about 300 MHz to 3000 MHz.

5. The shielding screen of claim 2 in which the insulating sheet is made of polyimide having a thickness of about one mil.

6. A radio signal shielding screen for use in an integrated antenna system that includes first, second and third antennas and an angle of incidence of signals emitted from each of said antennas onto the shielding screen, said shielding screen comprising:

a frequency selective surface disposed between the first and second antennas that is comprised of a symmetrical array of open center conductor elements and that is disposed orthogonal to a line extending between the first and second antennas, for reflecting signals transmitted by each of the respective first and second antennas to prevent their respective signals from impinging on the other of the first and second antennas, and for transmitting signals provided by the third antenna.

7. The shielding screen of claim 6 wherein the first and second antennas are adapted to radiate signals having closely spaced frequencies, and wherein the frequency selective surface comprises said symmetrical array of conductor elements that is adapted to reflect the signals having closely spaced frequencies transmitted by the respective first and second antennas to prevent their respective signals from impinging on the other of the first and second antennas.

8. The shielding screen of claim 6 wherein the frequency selective surface includes a thin dielectric substrate supporting said symmetrical array of conductor elements.

9. The shielding screen of claim 8 wherein the array of conductor elements is symmetrical and the conductor elements are symmetrical.

10. The shielding screen of claim 9 wherein the conductor elements are etched copper elements bonded to a polyimide substrate.

11. The shielding screen of claim 10 wherein the substrate has a thickness of about 0.001 inches.

12. The shielding screen of claim 11 wherein the frequency selective surface is adapted to reflect signals emitted by the first and second antennas and transmit signals emitted by the third antenna at incidence angles up to 60°.

13. The shielding screen of claim 9 wherein the conductor elements are open center square elements.

14. The shielding screen of claim 8 which further comprises a dielectric spacer disposed in contact with the dielectric substrate.

15. A radio signal shielding screen for use in an integrated antenna system that includes first, second and third antennas, and signals emitted from each of said antennas onto the shielding screen are radiated at respective predetermined angles of incidence relative to the shielding screen, said shielding screen comprising:

a frequency selective surface that comprises a dielectric substrate and a symmetrical array of open center conductor elements disposed on the substrate that is configured and dimensioned to reflect signals transmitted by the first and second antennas and transmit the signals transmitted by the third antenna, and wherein said frequency selective surface is disposed between the first and second antennas and that is disposed orthogonal to a line extending between the first and second antennas, for reflecting signals transmitted by each of the respective first and second antennas to prevent their respective signals from impinging on the other of the first and second antennas, and for transmitting signals provided by the third antenna.

16. The radio signal shielding screen of claim 15 wherein the first and second antennas are adapted to radiate signals having closely spaced frequencies, and wherein the symmetrical array of conductor elements is adapted to reflect the signals having closely spaced frequencies transmitted by the respective first and second antennas to prevent their respective signals from impinging on the other of the first and second antennas.

17. The shielding screen of claim 15 wherein the array of conductor elements is symmetrical and the conductor elements of the array are symmetrical.

18. The shielding screen of claim 17 wherein the conductor elements are etched copper elements disposed on a polyimide substrate.

19. The shielding screen of claim 18 wherein the conductor elements are open center square elements located at periodic intervals with respect to adjacent ones of the conductor elements.

20. The shielding screen of claim 19 wherein the shielding screen comprises a flat surface.

21. The shielding screen of claim 20 wherein the shielding screen comprises a curved surface.

22. An integrated antenna system comprising:

first, second and third antennas adapted to emit respective first, second and third signals; and a shielding screen comprising a frequency selective surface comprising a symmetrical array of open center conductor elements disposed between the first and second antennas and that is disposed orthogonal to a line extending between the first and second antennas, for reflecting signals transmitted by each of the respective first and second antennas to prevent their respective signals from impinging on the other of the first and second antennas, and for transmitting signals provided by the third antenna and an angle of incidence of signals emitted from each of said antennas onto the shielding screen is less than sixty degrees.

23. The integrated antenna system of claim 22 wherein the first and second antennas are adapted to radiate respective first and second signals having closely spaced frequencies, and wherein the array of conductor elements is adapted to reflect the signals having closely spaced frequencies transmitted by the respective first and second antennas to prevent their respective signals from impinging on the other of the first and second antennas.

24. The shielding screen of claim 22 wherein the frequency selective surface includes thin dielectric substrate supporting the symmetrical array of conductor elements.

25. The shielding screen of claim 24 wherein the array of conductor elements is symmetrical and the conductor elements of the periodic array are symmetrical.

26. The shielding screen of claim 25 wherein the conductor elements are etched copper elements bonded to a polyimide substrate.

27. The shielding screen of claim 26 wherein the conductor elements are open center square elements.

28. The shielding screen of claim 27 wherein the conductor elements are open center square elements located at periodic intervals with respect to adjacent ones of the conductor elements.

* * * * *